United States Patent [19]

Mizosaki

[11] Patent Number: 5,695,562
[45] Date of Patent: Dec. 9, 1997

[54] PROCESSING APPARATUS

[75] Inventor: Kengo Mizosaki, Kumamoto, Japan

[73] Assignees: Tokyo Electron Limited, Tokyo;
Tokyo Electron Kyushu Limited,
Tosu, both of Japan

[21] Appl. No.: 527,336

[22] Filed: Sep. 12, 1995

[30] Foreign Application Priority Data

Sep. 13, 1994 [JP] Japan .................................. 6-244823

[51] Int. Cl.$^6$ ................................................. B05C 11/00
[52] U.S. Cl. ........................ 118/712; 118/669; 118/676; 250/223 R
[58] Field of Search ..................... 414/935–940; 118/712, 668, 676; 356/372, 375, 399, 400; 198/347.1, 347.4, 418; 250/491.1, 216, 234, 559.4, 208.2, 223 R, 397, 400

[56] References Cited

U.S. PATENT DOCUMENTS

| | | | |
|---|---|---|---|
| 3,902,615 | 9/1975 | Levy et al. ................................ | 414/935 |
| 5,203,445 | 4/1993 | Shiraiwa ................................. | 198/464.3 |
| 5,239,182 | 8/1993 | Tateyama et al. ....................... | 250/561 |
| 5,406,092 | 4/1995 | Mokuo ..................................... | 414/936 |

FOREIGN PATENT DOCUMENTS

| | | |
|---|---|---|
| 2664525 | 1/1992 | France . |
| 4-321253 | 11/1992 | Japan . |
| 6-143177 | 5/1994 | Japan . |

Primary Examiner—Donald E. Czaja
Assistant Examiner—Calvin Padgett
Attorney, Agent, or Firm—Oblon, Spivak, McClelland, Maier & Neustadt, P.C.

[57] ABSTRACT

A processing apparatus comprises a carrier rest portion for placing thereon carriers each of which stores a plurality of plate-like target bodies substantially horizontally with gaps therebetween in the vertical direction and which has a front surface forming a target body transfer port and a side surface having a light-transmitting portion, a convey mechanism having a target body holding member which is movable back and forth and movable vertically relative to the carrier rest portion to sequentially extract and transfer target bodies in the carrier to a processing unit, and photocoupler and a mirror, provided to the convey mechanism to oppose each other through part of the target body in the horizontal direction, for detecting presence/absence of a target body in each stage of the carrier on the carrier rest portion.

14 Claims, 6 Drawing Sheets

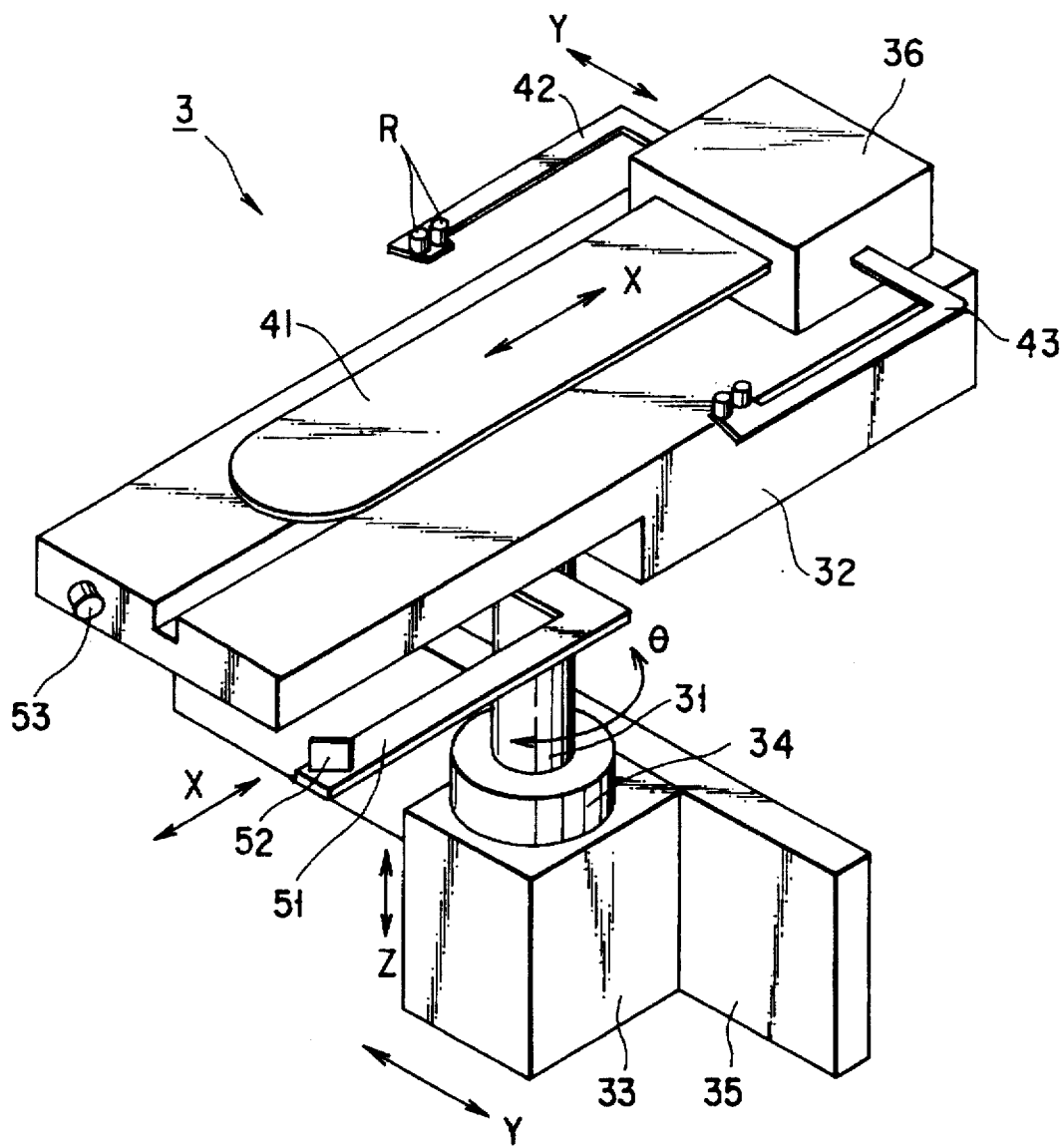
F I G. 2

PROCESSING APPARATUS

BACKGROUND OF THE INVENTION

1. Field of the Invention

The present invention relates to a processing apparatus for, e.g., coating and developing a target substrate.

2. Description of the Related Art

In general, in the manufacturing process of a liquid crystal display (LCD) device, an ITO (Indium Tin Oxide) thin film, an electrode pattern, and the like are formed on an LCD substrate (glass substrate). For this formation, a series of processing operations are performed in which the circuit pattern and the like are reduced and transferred on a photoresist by using a photolithography technique similar to that used in the semiconductor manufacturing process, and the transferred circuit pattern and the like are developed. To perform these processing operations, a coating/developing system which applies a resist solution to the metal/insulating thin film on the LCD substrate and develops the exposed thin film, and an exposure system coupled to the coating/developing system are installed in a clean room.

A conventional coating/developing system will be described with reference to FIG. 8.

This processing apparatus is constituted by a loading/unloading unit A forming the loading/unloading port of glass substrates G and a processing unit B. The loading/unloading unit A has a carrier rest portion 11 for placing thereon, e.g., four carriers C each for storing a plurality of glass substrates G, and a convey mechanism 12 for transferring the glass substrates G from the carriers C to the processing unit B and vice versa. Each carrier C is constituted by a frame body to store the plurality of glass substrates G on its shelves, and holds the four corners and predetermined side portions of each glass substrate G by the shelves.

The convey mechanism 12 is obtained by providing substrate-conveying tweezers 14 to a convey portion body 13, which is movable in Y, Z, and θ directions, to be movable back and forth (movable in the X direction). The convey mechanism 12 enters the tweezers 14 into the carrier C to receive the glass substrate G from the carrier C. To perform this transfer, the control system needs to know the presence/absence of a glass substrate G in each stage or shelf of the carrier C. For this purpose, a mapping sensor is provided dividedly on the carrier rest portion 11 side and the convey mechanism 12 side. More specifically, a light-emitting/receiving portion 15 is mounted on the front surface portion of the convey portion body 13, and longitudinally elongated mirrors 16 corresponding to the height of the carriers C is fixedly arranged on the sides of the respective carriers C to reflect light emitted from the light-emitting/receiving portion 15 toward the light-emitting/receiving portion 15. These light-emitting/receiving portion 15 and mirrors 16 constitute the mapping sensor. When the mapping sensor scans the corresponding carrier C by vertically moving the convey portion body 13 from the upper level to the lower end level of the carrier C, the optical path of the mapping sensor is blocked, at a stage where the glass substrate G is stored, by the glass substrate G. The presence/absence of the glass substrate G on each stage in the carrier C is thus detected.

The convey mechanism 12 is moved to a position opposing a predetermined carrier C, performs mapping in the manner as described above, and extracts the glass substrates G from the carrier C and transfers them to a main arm 17 of the processing unit B one by one. The main arm 17 conveys the received glass substrate G to each processing section.

For example, the main arm 17 sequentially conveys the glass substrate G to a cleaning section B1, an adhering section B2, a cooling section B3, coating sections B4, and heating section B5, so that a resist film is formed by coating the surface of the glass substrate G with a resist solution. In FIG. 8, developing sections B6 develop the exposed glass substrates G.

The above apparatus has problems as follows.

A carrier C is sometimes placed on the carrier rest portion 11 by a manual operation to adjust the respective portions, e.g., the convey portion body 13 and the main arm 17. Since the longitudinally elongated mirrors 16 are fixed between the carriers C, this placing operation is difficult to perform. If a carrier C or the operator erroneously touches any mirror 16, the angle of the mirror 16 must be adjusted. If the operator does not notice that he or a carrier C has touched a mirror 16 and the angle of the mirror 16 has thus changed, an accurate mapping operation cannot be performed. Then, a glass substrate G is erroneously recognized to be present in a stage of a carrier C which is actually empty, and a convey operation is performed. In this case, the glass substrate G is not transferred correctly.

When a carrier C is conveyed between the outside and the carrier rest portion 11 by an AGV (automatic convey robot), an error occurs in the placing position of the carrier C on the carrier rest portion 11 in accordance with the convey precision of the AGV. Thus, the placing position is not always constant. If the placing position falls outside the allowable range demanded by the convey mechanism 12, troubles such as failure of receiving the glass substrate G occur. When the convey precision of the AGV is to be increased to avoid these troubles, the control operation of the AGV becomes very difficult.

SUMMARY OF THE INVENTION

It is an object of the present invention to provide a processing apparatus which can accurately detect presence/absence of a target substrate in each stage of a carrier, thus correctly transferring the target substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 2 is a perspective view of the target substrate convey mechanism of the system shown in FIG. 1;

DETAILED DESCRIPTION OF THE PREFERRED EMBODIMENT

Figure 1:
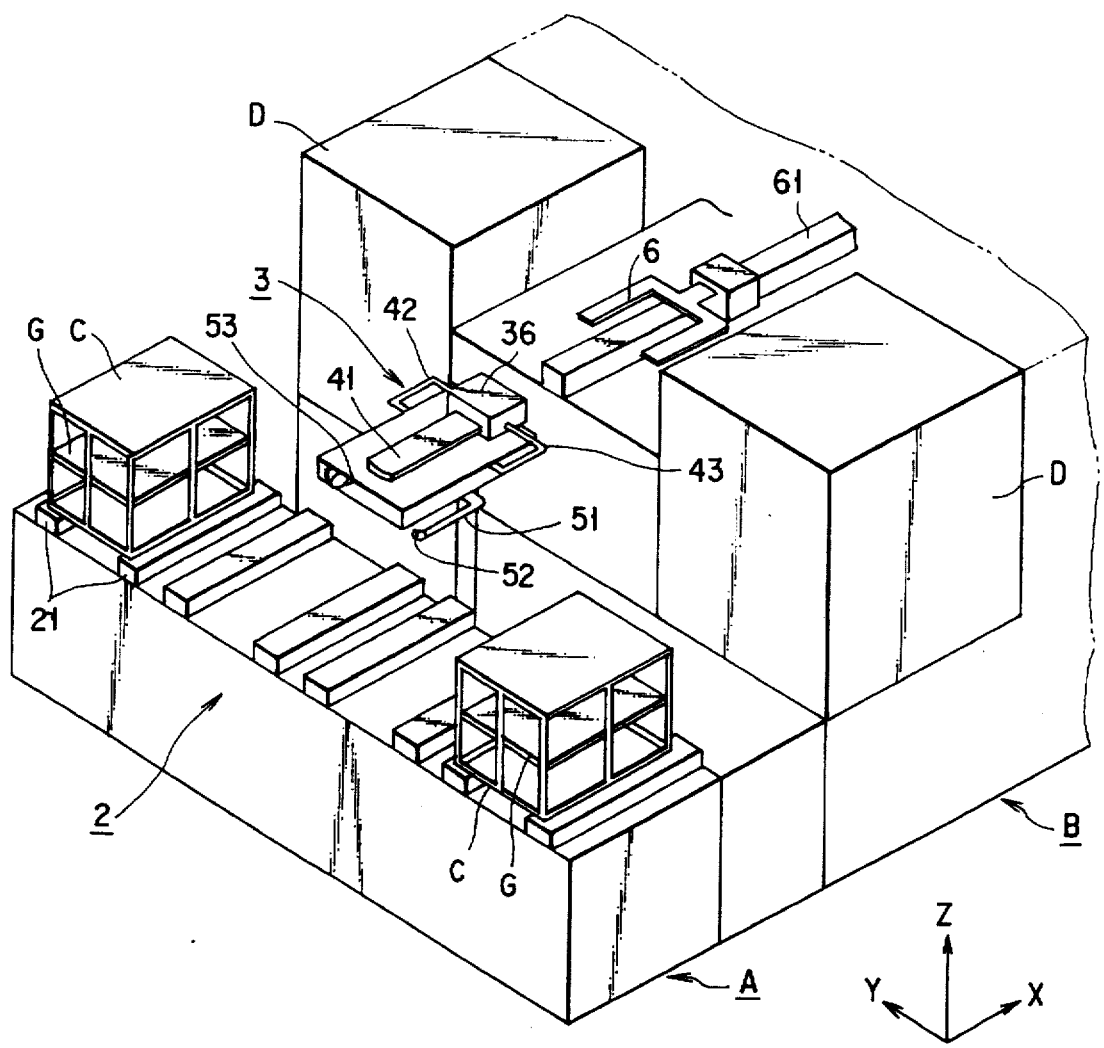
FIG. 1 is a perspective view showing part of a coating/developing system to which a processing apparatus according to an embodiment of the present invention is applied.

FIG. 1 is a view showing an embodiment in which the present invention is applied to a coating/developing system. This coating/developing system has a loading/unloading unit A for a plate-like target body, e.g., a glass substrate used for an LCD, and a processing unit B for coating and developing the target body. The loading/unloading unit A has a carrier rest portion 2 for placing thereon, e.g., four carriers C in series each for storing glass substrates G, and a target body convey mechanism 3 for transferring the glass substrates G in the carriers C to the processing unit B.

Pairs of support tables 21 for supporting the bottom surfaces of corresponding carriers C are provided on the carrier rest portion 2 to extend along the right and left edges of the bottom surfaces of the corresponding carriers C. Each carrier C is constituted by a frame body to store a plurality of, e.g., 25, rectangular glass substrates G (only one glass substrate is shown in FIG. 1 for the sake of illustrative convenience) on its shelves, and holds the four corners and predetermined side portions of each glass substrate G with groove portions formed in the peripheral walls of the frame body. The front vertical opening portion (the convey mechanism 3 side in FIG. 1) of the carrier C serves as a target substrate transfer port.

As shown in detail in FIG. 2, the convey mechanism 3 has a convey portion body 32 mounted on a rotating shaft 31 movable in the θ direction (rotatable about the Z axis as the center). The rotating shaft 31 can be rotated in the θ direction by a motor 34 which is vertically moved by an elevating portion 33. The elevating portion 33 can be moved in the Y direction by a Y-direction moving mechanism 35. Accordingly, the convey portion body 32 can move in the Y, Z, and θ directions. A movable portion 36 is provided on the convey portion body 32. The movable portion 36 can be moved back and forth (movable in the X direction) along the surface of the convey portion body 32 by, e.g., a belt mechanism incorporated in the convey portion body 32. A target body holding member, e.g., tweezers 41 that holds the lower surface of a glass substrate G by vacuum suction, is provided on the front surface of the movable portion 36 to project horizontally.

A pair of arms 42 and 43 are provided on the two sides of the movable portion 36, such that they extend to the left and right, respectively, are bent at the right angle, and extend forward. These arms 42 and 43 are moved by a driving unit in the movable portion 36 to move in the interlocked manner, thereby performing an opening/closing operation in the Y direction (to come close to and separate from each other). Press rollers R are rotatably provided on the upper surfaces of the distal end portions of the arms 42 and 43. The press rollers R clamp, under pressure, the two side edges of a corresponding glass substrate G in the carrier C, thereby correcting the direction of the glass substrate G.

An L-shaped arm 51 is provided on one side (left side) of the convey portion body 32, and can be moved back and forth (moved in the X direction) by the driving unit of, e.g., an air cylinder (not shown). The arm 51 is moved forward when the convey portion body 32 is located at a position to oppose the carrier C set on the carrier rest portion 2, and extends to a position outside the left-side surface portion of this carrier C. A first optical detecting means (in this embodiment, a mirror) 52 is provided on the upper surface of the distal end portion of the arm 51. A second optical detecting means (in this embodiment, a light-emitting/receiving portion or photocoupler obtained by combining a light-emitting element, e.g., a light-emitting diode or a light-emitting transistor, and a light-receiving element, e.g., a photodiode or a phototransistor) 53 is provided on the front surface portion of the convey portion body 32 (although being located on the right side of the center in this embodiment, it can be located near the center). These light-emitting/receiving portion 53 and mirror 52 are located on the same horizontal plane, and set at positions such that, when the arm 51 is extended, light emitted from the light-emitting portion of the light-emitting/receiving portion 53 is reflected by the mirror 52 and is returned to the right-receiving portion of the light-emitting/receiving portion 53. More specifically, the mirror 52 and light-emitting/receiving portion 53 are set such that light emitted from the light-emitting/receiving portion 53 is incident on the glass substrate G through its front surface at a predetermined angle, emerges from a side surface of the glass substrate G, is reflected by the mirror 52, becomes incident on the glass substrate G again through its side surface, emerges from the front surface of the glass substrate G, and is received by the light-emitting/receiving portion 53. In this manner, an optical path 53a (FIG. 3) of the above emitted and reflected light is substantially parallel to the horizontal surface of the glass substrate G and forms predetermined angles with the side and front surfaces of the glass substrate G. As a result, light is partly absorbed by the glass substrate G. Thus, the amount of light received by the light-emitting/receiving portion 53 is smaller when compared to a case wherein a glass substrate is not present (when the amount of light emitted by the light-emitting/receiving portion 53 is small, the amount of received light becomes almost zero). In this manner, the presence/absence of the glass substrate can be detected from the amount or presence/absence of received light. These mirror 52 and light-emitting/receiving portion 53 constitute a pair of optical detecting means forming a mapping sensor that performs mapping of the glass substrate G in the carrier C (checking of the presence/absence of the glass substrate G on each stage).

The entire arrangement of the processing unit B will be described later. The processing unit B has processing sections (denoted by symbols D in FIG. 1), e.g., a coating section necessary for applying a resist solution to the surface of the glass substrate G, developing sections for performing development after pattern exposure, and the like. The respective processing sections D are arranged on the two sides of a convey path 61 of a substrate-conveying main arm 6 that extends in the center of the processing unit from the front side to the rear side. The main arm 6 transfers the target substrate between the convey mechanism 3 and a predetermined processing section D, and between the respective processing sections D, and can move in the X, Y, Z, and θ directions.

Figure 3:
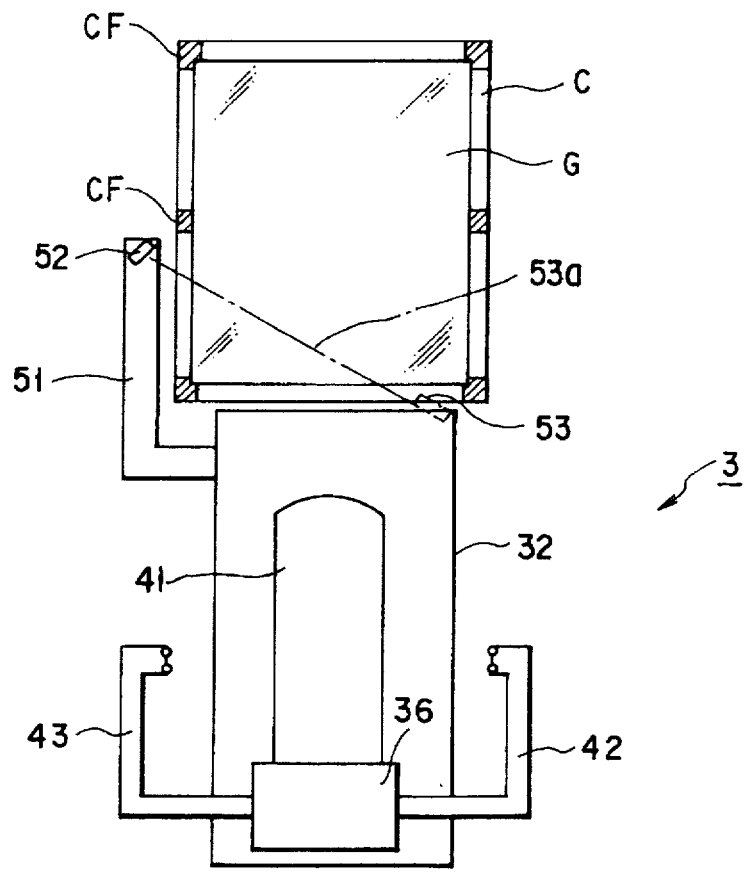
FIG. 3 is a plan view showing the mapping state of the system shown in FIG. 1.

The operation of the above embodiment will be described. First, a carrier C storing, e.g., 25 glass substrates G is conveyed from the outside by, e.g., an automatic convey robot or an operator, and placed on the support tables 21 of the carrier rest portion 2 such that the opening portion of the front surface of the carrier C faces the processing unit B. Subsequently, the convey portion body 32 of the convey mechanism 3 is located to oppose the front surface of the carrier C, and the mapping operation is performed. More specifically, as shown in FIG. 3, the arm 51 is moved forward outside the side surface portion of the carrier C so that it is extended. As a result, the optical path 53a is formed between the mirror 52 and the light-emitting/receiving portion 53.

In this state, the convey portion body 32 is vertically moved so that the optical path 53a is scanned from the level of the highest stage of the carrier C to the level of the lowest stage of the carrier C (or vice versa). Since a portion of the side surface portion of the carrier C where a frame body CF does not exist is open, light from the light-emitting/receiving portion 53 is reflected, at a stage where no glass substrate G exists, by the mirror 52 and is returned to the light-emitting/ receiving portion 53. At a stage where a glass substrate G exists, the optical path is blocked by the glass substrate G, and light thus cannot be received by the light-emitting/ receiving portion 53. An output signal from the light-emitting/receiving portion 53 is sent to the control system. The control system can determine a specific stage, to which the glass substrate G is stored, based on the signal indicating whether the light-emitting/receiving portion 53 has received the light and position information of the 25 glass substrates that has been input in advance, and can control the convey mechanism 3 so that it will not erroneously access an empty stage of the carrier C.

Thereafter, the glass substrates G are sequentially extracted from the carrier C by the convey mechanism 3 and transferred to the main arm 6 of the processing unit B. To extract the glass substrates G, the movable portion 36 of the convey mechanism 3 is moved forward to cause the tweezers 41 to enter a gap between the glass substrates G that are vertically arranged. The arms 42 and 43 are operated in the closing direction to clamp the glass substrate G from the two sides with the press rollers R, thereby setting the glass substrate G in a predetermined direction. Subsequently, the movable portion 36 is moved upward, and the glass substrate G is picked up and held by the tweezers 41. Thereafter, the tweezers 41 are moved backward, thereby extracting one glass substrate G from the carrier C. Then, the glass substrate G is transferred from the convey mechanism 3 to the main arm 6, and is subjected to coating, exposure, and development as will be described later.

According to this embodiment, during mapping of the glass substrates G in the carrier C, the arm 51 of the convey mechanism 3 is extended to form an optical path with the mirror 52 on the arm 51 and the light-emitting/receiving portion 53 on the convey portion body 32 side. The presence/absence of the glass substrate G in each stage is detected based on whether this optical path is blocked. When the carrier C is to be placed on or removed from the carrier rest portion 2, when, in automated conveyance of the carrier C, the carrier C is to be manually loaded or unloaded for maintenance, and when the support tables 21 of the carrier rest portion 2 are to be adjusted, the operation can be easily performed because the mirror does not exist on the carrier rest portion 2. As the carrier C or the operator's body will not partly touch the mirror, the optical path will not be undesirably shifted. Thus, the mapping operation can be performed reliably, allowing accurate transfer of the glass substrate G.

In the above apparatus, the first optical detecting means 52 may comprise a photocoupler, and the second optical detecting means 53 may comprise a mirror. The first optical detecting means 52 may comprise either a light-emitting element or a light-receiving element, and the second optical detecting means 53 may comprise the remaining one of the light-emitting and light-receiving elements, so that light emitted from the light-emitting element is received by the light-receiving element. An arm similar to the arm 51 may also be provided on the other side of the convey portion body 32, and the second optical detecting means 53 may be provided to this arm. However, the larger and the thinner the glass substrate, the more largely the central portion of the glass substrate is flexed by its own weight. When the optical path extends through the flexed portion, an erroneous operation may occur. Thus, when the glass substrate is large/thin, it is preferable that a detecting means be provided such that its optical path runs across the corner portion of the substrate, as in this embodiment.

It is preferable that the carrier rest portion 2 have an arrangement which is to be described as follows.

Figure 4:
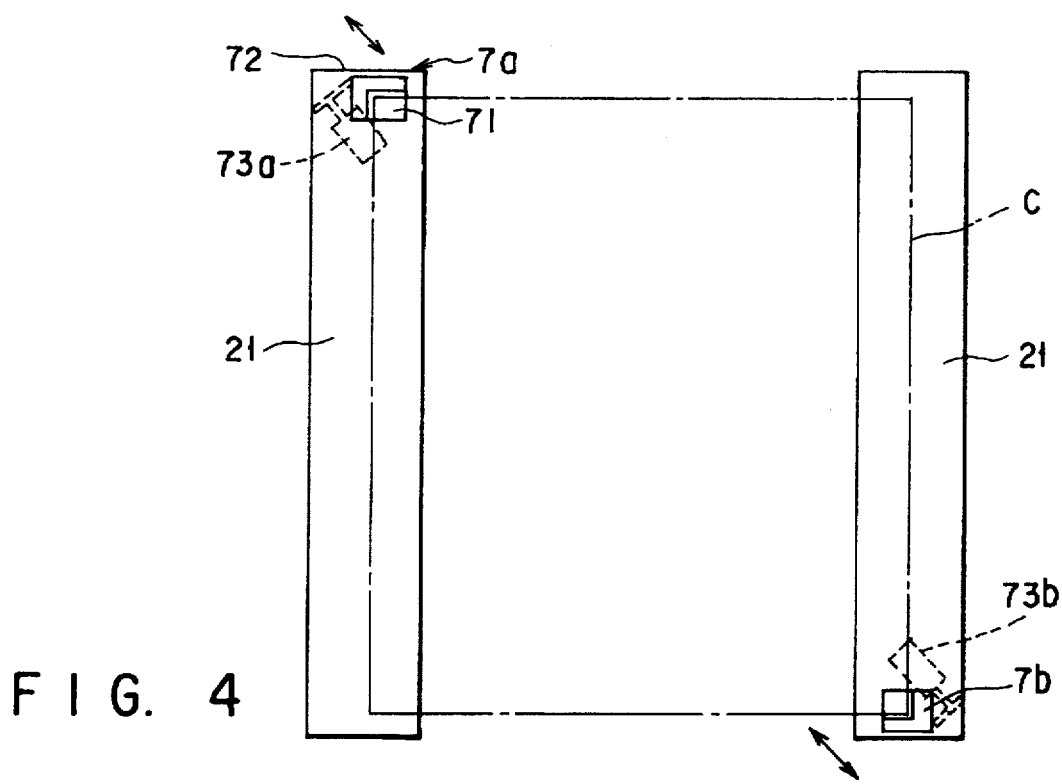
FIG. 4 is a plan view showing aligning members on the carrier rest portion of the system shown in FIG. 1.
Figure 5:
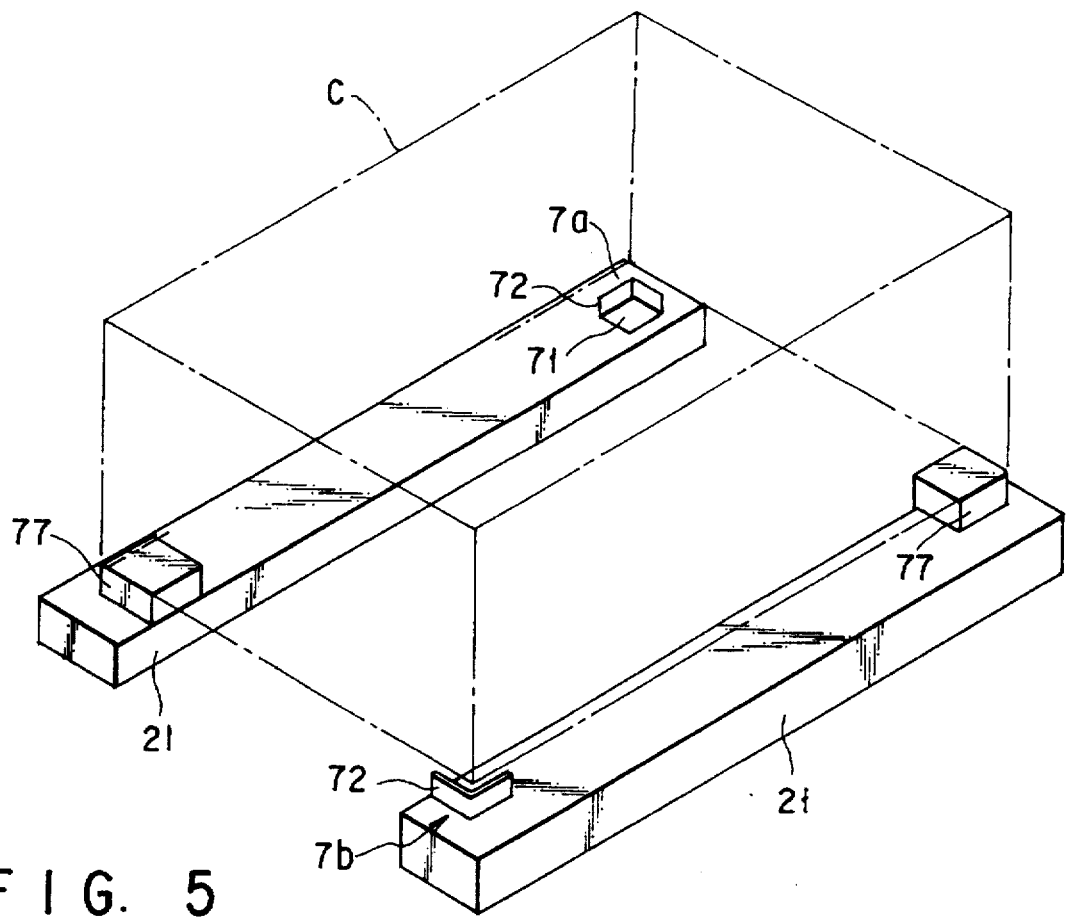
FIG. 5 is a perspective view showing the aligning members on the carrier rest portion of the system shown in FIG. 1.

As shown in FIGS. 4 and 5, a pair of aligning members 7a and 7b are provided on each pair of support tables 21. The pair of aligning members 7a and 7b constitute aligning means that support, of the four corners of the bottom surface of the carrier C, two corners opposing each other in the direction of one diagonal line. Each aligning member 7a (or 7b) has a horizontal surface portion 71 made of a rectangular plate that supports the bottom surface of the carrier C, and an L-shaped portion 72 made of an L-shaped plate. The L-shaped portion 72 is provided upright vertically on the horizontal surface portion 71, and has an inner surface extending in the X direction and an inner surface extending in the Y direction to match with the corner portion (more specifically, the corner portion of the frame body). These plates 71 and 72 are made of, e.g., a fluoroplastic so that they will not form dust upon friction with the carrier C.

Figure 6:
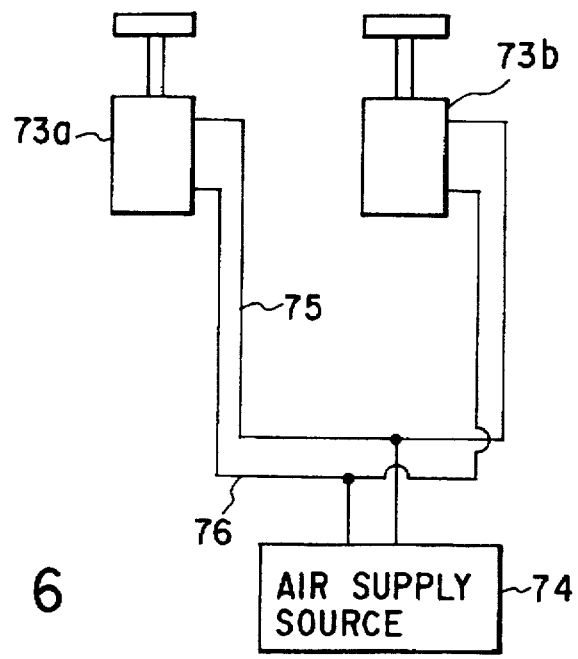
FIG. 6 is a diagram showing the air pipes of air cylinders that actuate the aligning members of the system shown in FIG. 1.

These aligning members 7a and 7b are provided to the support tables 21 to be movable on the upper surface of the support tables 21 in the direction of the diagonal line of the carrier C. Guide means are preferably provided to guide the aligning members 7a and 7b in the direction of the diagonal line. For example, this guide means can be constituted by a groove or slot which is formed in the upper surface of the corresponding support table 21 to extend in the diagonal direction, and a projecting portion formed on the lower surface of the corresponding aligning member to be inserted in the groove or slot. An air cylinder 73a (73b) is provided to each support table 21. The pistons of the air cylinders 73a and 73b are connected to the aligning members 7a and 7b, respectively. As a result, the aligning members 7a and 7b can be moved, as indicated by arrows in FIG. 4, by the air cylinders 73a and 73b in a direction to equally divide an angle (90°) defined by the two inner surfaces of the L-shaped portion 72, i.e., in the 45°-direction of a coordinate system defined by X and Y axes. As shown in FIG. 6, a forward-movement air supply pipe 75 and a backward-movement air supply pipe 76 both connected to a common air supply source 74 are branched from the air cylinders 73a and 73b, respectively, and the branching ends of the branched pipes 75 and 76 are connected to each other. Accordingly, when air is supplied to the forward- or backward-movement air supply pipe 75 or 76, the air cylinders 73a and 73b are actuated simultaneously by air having the same pressure, that is, the air cylinders 73a and 73b are actuated in the interlocked manner, and the aligning members 7a and 73b are moved inward or outward simultaneously in the direction indicated by arrows in FIG. 4.

Fixing tables 77 made of, e.g., a fluoroplastic, and each having a horizontal support surface are fixed the support tables 21. The fixing tables 77 support the remaining two corners of the four corners of the lower surface of the carrier C at the same level as the horizontal surface portions 71 of the aligning members 7a and 7b.

When the aligning members 7a and 7b are provided to the carrier rest portion 2 in this manner, the carrier C can be aligned in the following manner. When the carrier C is transferred from the outside onto the support tables 21 on the carrier rest portion 2 by, e.g., the automatic convey robot, the four corners of the lower surface of the carrier C are respectively supported on the horizontal surface portions 71 of the aligning members 7a and 7b and the fixing tables 77 at a positioning precision corresponding to the convey precision of the automatic convey robot.

The air cylinders 73a and 73b are actuated to simultaneously move the aligning members 7a and 7b inward in the direction indicated by the arrows in FIG. 4, thereby clamping the carrier C in the diagonal direction. Thus, the carrier C is pressed in the X and Y directions. More specifically, when the central position and direction of the carrier C fall outside a predetermined position, the carrier C is positionally corrected as it is guided by the vertical inner surfaces of the aligning members 7a and 7b, and is stopped as it is finally set at a position where it is clamped by the aligning members 7a and 7b. Accordingly, if this stop position is preset in advance to correspond to the transfer position of the convey mechanism 3, the carrier C is aligned by the aligning members 7a and 7b at high precision.

With this arrangement, when the carrier C is conveyed by, e.g., an automatic convey robot, although a placing error is included, the carrier C is automatically aligned after it is placed. Thus, transfer of the glass substrate G by the convey mechanism can be performed reliably, and the automatic convey robot need not have high placing precision. When the carrier C is to be placed manually, it need not be aligned accurately but can be placed roughly to a certain extent, thus facilitating the operation.

In the above embodiment, although the pair of aligning members 7a and 7b are moved in the interlocked manner, one of them may be fixed. When one aligning member is fixed, however, the stroke of the movable portion of the other aligning member becomes large, leading to an increase in size of the support tables 21 or easily forming particles. Therefore, it is preferable that the aligning members 7a and 7b be moved in the interlocked manner. When the aligning members are of an interlocking type, they are not limitedly driven by the air cylinders, but a synchronization mechanism such as a belt or a pinion-and-rack mechanism may be employed. If air cylinders are employed, as described above, and the aligning members are moved by a common air supply source, the arrangement is advantageously simple.

In the present invention, the carrier C is aligned directly. However, in place of this, a rest table for placing the carrier C thereon may be provided, and the carrier C may be aligned through the rest table by using an aligning means that moves the rest table. In this case, sensors, e.g., a plurality of optical sensors, for detecting the X and Y positions of the carrier C may be provided, and the aligning means may be controlled based on signals from the sensors. In this case, since the carrier C does not move on the rest table, dust will not be formed by friction to attach to the carrier C.

The arrangement of the respective portions of a system obtained by combining an automatic convey robot (usually called, e.g., an AGV) serving as a carrier convey mechanism and a coating/developing system, and the flow of the processing operation of this combined system will be briefly described with reference to FIG. 7.

Figure 7:
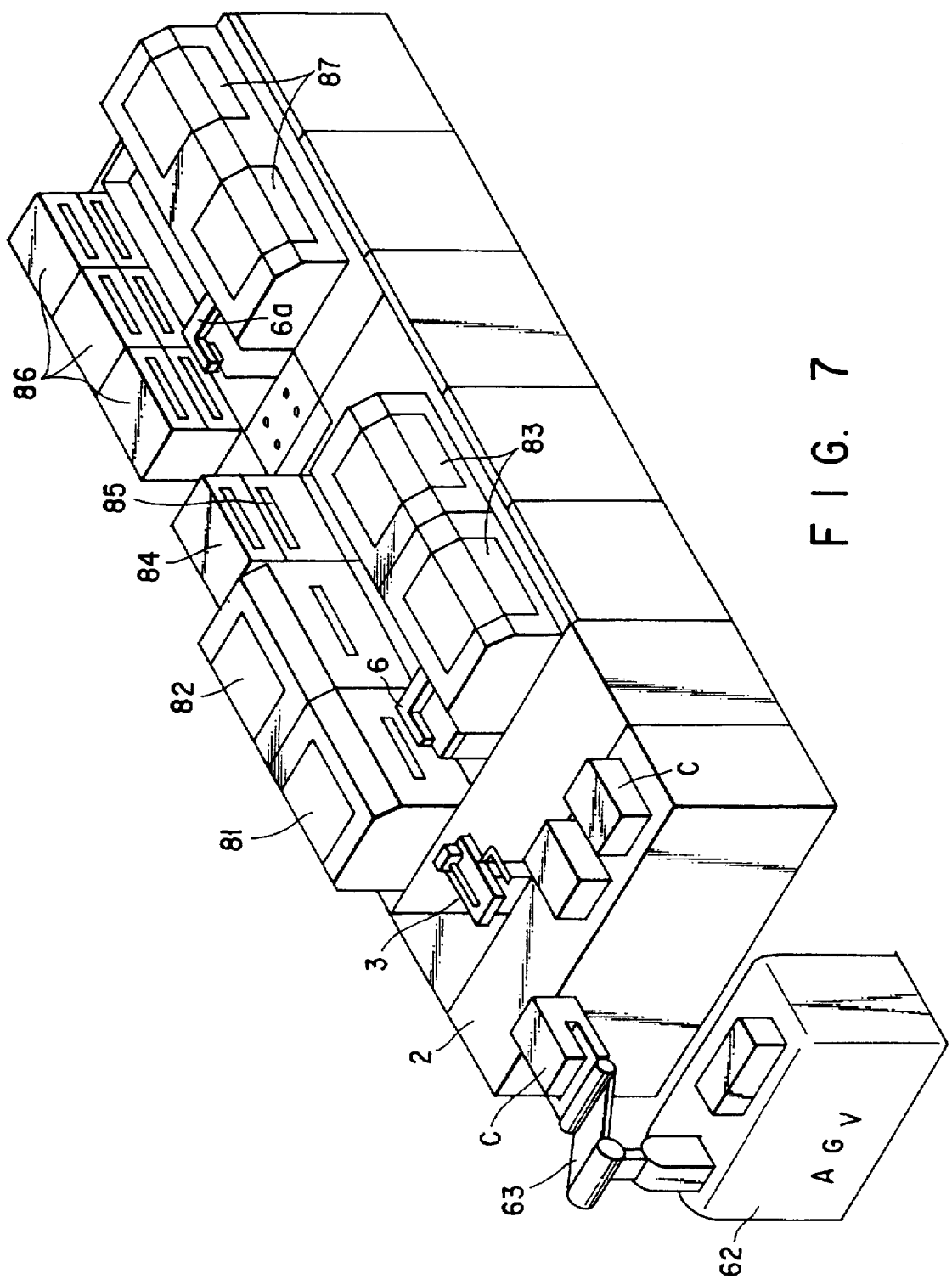
FIG. 7 is a perspective view showing the overall appearance of the coating/developing system shown in FIG. 1.
Figure 8:
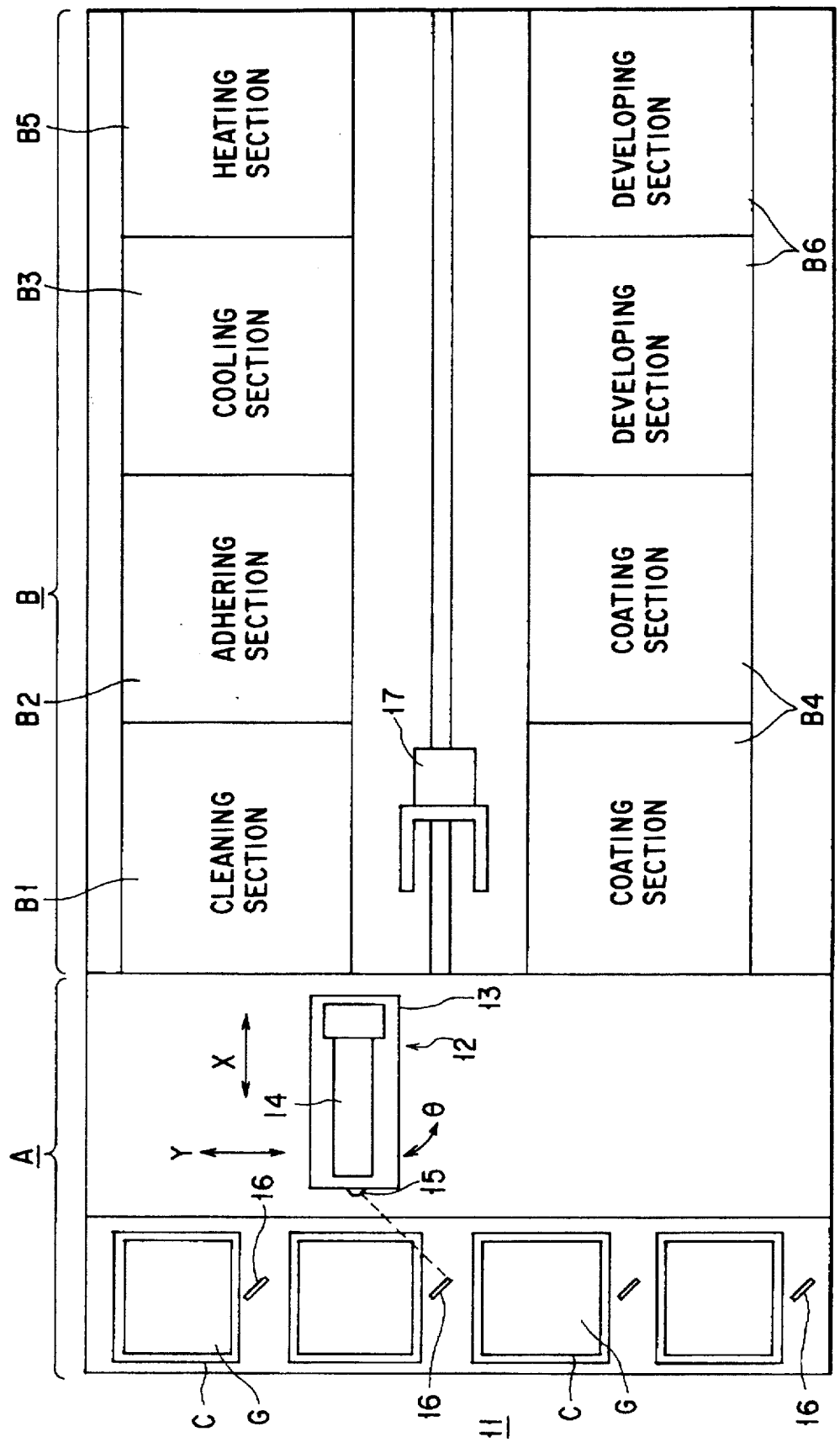
FIG. 8 is a plan view schematically showing a conventional coating/developing system.

As described above, the carrier rest portion 2 and the target substrate convey mechanism 3 incorporate the aligning members and the mapping sensor, although not shown in FIG. 7. Reference numeral 62 denotes an automatic convey robot. The automatic convey robot 62 transfers the carrier C to the carrier rest portion 2 by an arm 63.

An unprocessed glass substrate is extracted from the carrier C by the convey mechanism 3, transferred to the main arm 6, and conveyed into a brush cleaning section 81 first. The glass substrate brush-cleaned in the brush cleaning section 81 is successively cleaned with high-pressure jet water in a jet water cleaning section 82 as required. Thereafter, the glass substrate is subjected to the hydrophobic process by an adhering section 84 and cooled by a cooling section 85. Then, a photoresist film, e.g., a photosensitive film, is formed on this glass substrate by coating with a coating unit 83. The photoresist is pre-baked by heating by a heating section 86, and a predetermined pattern on the substrate is exposed by an exposure unit (not shown) arranged on the right side of this system. The exposed glass substrate is conveyed into a developing section 87 through a main arm 6a. The substrate is subjected to development with a developing solution. The developed glass substrate is returned into, e.g., the original carrier C through the main arm 6 and the convey mechanism 3.

In the above description, the target substrate is a glass substrate for an LCD panel. However, the present invention is not limited to this, and the target substrate may be a glass mask, a printed circuit board, a semiconductor wafer, or the like.

According to the present invention, a pair of optical detecting means are provided to the target substrate convey mechanism to detect the presence/absence of a target substrate in each stage of the carrier. Thus, when placing a carrier on the carrier rest portion manually, the placing operation is facilitated. As the carrier or the operator will not accidentally touch the optical detecting means, the adjustment of the optical detecting means will not be undesirably changed, thus allowing accurate mapping.

Since an aligning means for aligning the carrier or the rest table is provided to the carrier rest portion, when transferring the carrier by the carrier convey mechanism, the target substrate can be reliably transferred from the carrier by the target substrate convey mechanism. This aligning means is conveniently used when manually placing a carrier as well.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A processing apparatus comprising:
 a carrier rest portion for placing thereon at least one carrier which stores a plurality of plate-like target bodies substantially horizontally with gaps the, therebetween in the vertical direction and which has a front surface forming a target body transfer port and a side surface having a light-transmitting portion;
 a convey mechanism which is at least movable back and forth and movable vertically relative to said carrier rest portion to sequentially extract and transfer target bodies in said carrier to a processing unit, the mechanism including a holding member for holding a target body, a convey portion body for supporting the holding member and an arm having a supporting part, which is to be extended from said convey portion body along said side surface of the carrier on the outside of the carrier so that the supporting part faces the light transmitting portion of the side surface; and a pair of optical detecting means, one being provided to said convey portion body and another being supported by the supporting part of the arm so that the pair of optical detecting means face each other through the light transmitting portion and a part of the target body in the horizontal direction, and wherein said convey mechanism is moved vertically to move said pair of optical detecting means to successively detect the presence/absence of plate-like target bodies in successive stages of said carrier on said carrier rest portion.

2. An apparatus according to claim 1, wherein said arm is provided to said convey portion body to be movable relative to the convey portion body back and forth along one side of said carrier.

3. An apparatus according to claim 2, wherein said one of said optical detecting means has one optical component of a mirror and a photocoupler, said another optical detecting means has the other optical component, and light emitted from said photocoupler is reflected by said mirror and received by said photocoupler.

4. An apparatus according to claim 2, wherein said one of said optical detecting means has one optical element of a light-emitting element and a light receiving element, said another optical detecting means has the other optical element, and light emitted from said light-emitting element is received by said light-receiving element.

5. An apparatus according to claim 1, further comprising aligning means for aligning said carrier on said carrier rest portion.

6. An apparatus according to claim 5, wherein said aligning means includes a pair of aligning members, provided to oppose each other, for aligning said carrier on said carrier rest portion by guiding said carrier from two sides thereof of a diagonal direction of said carrier.

7. An apparatus according to claim 6, wherein said carrier has a square lower surface, and said pair of aligning members guide opposing corner portions of said carrier or said rest table such that said pair of aligning members are moved close to each other, and are formed into shapes to match with said corner portions.

8. An apparatus according to claim 7, further comprising moving means for moving said pair of aligning members simultaneously in opposite directions.

9. An apparatus according to claim 8, wherein said moving means comprises air cylinders respectively connected to said pair of aligning members, and means for supplying air to said air cylinders simultaneously.

10. An apparatus according to claim 1, wherein only said pair of optical detecting means are utilized for detecting the presence/absence of target bodies stored in said carrier.

11. An apparatus according to claim 1, wherein said holding member includes an elongated plate having a width narrower than that of the target body, the elongated plate supporting the target body thereon so that side portions of the target body extend from lateral sides of the elongated plate, and wherein the apparatus further includes alignment means for aligning the target body on the elongated plate.

12. An apparatus according to claim 11, wherein said alignment means includes a pair of pressing members for pressing lateral end faces of the target body disposed on the elongated plate.

13. An apparatus according to claim 12, wherein each of said pressing members includes a support arm which extends from the convey mechanism along a lateral end face of the target body and a roller rotatably supported on the support arm, the roller having a peripheral surface pressing the lateral end face of the target body disposed on the elongated plate.

14. An apparatus according to claim 1, wherein said one of said pair of optical detecting means is positioned on the convey portion body at a position which is offset from a center line of the convey portion body and in a direction with regard to said center line away from the side surface of the carrier.

* * * * *